(12) United States Patent
Gupta et al.

(10) Patent No.: US 6,864,987 B2
(45) Date of Patent: Mar. 8, 2005

(54) INTERFEROMETER HAVING IMPROVED MODULATION DEPTH AND FREE-SPECTRAL RANGE AND METHOD OF MANUFACTURING

(75) Inventors: Vikas Gupta, Breinigsville, PA (US); Kaushal K. Verma, Breinigsville, PA (US)

(73) Assignee: TriQuint Technology Holding Co., Hillsboro, OR (US)

(*) Notice: Subject to any disclaimer, the term of this patent is extended or adjusted under 35 U.S.C. 154(b) by 210 days.

(21) Appl. No.: 10/225,649

(22) Filed: Aug. 22, 2002

(65) Prior Publication Data

US 2004/0036888 A1 Feb. 26, 2004

(51) Int. Cl.[7] .................................................. G01B 9/02
(52) U.S. Cl. ...................................... 356/491; 356/519
(58) Field of Search ................................. 356/450, 451, 356/480, 491, 519; 372/32, 94

(56) References Cited

U.S. PATENT DOCUMENTS 6,201,609 B1 * 3/2001 Hill et al. .................... 356/491
6,323,987 B1 * 11/2001 Rinaudo et al. ............. 359/260
6,646,745 B2 * 11/2003 Verma et al. ................ 356/450

* cited by examiner

Primary Examiner—Samuel A. Turner
Assistant Examiner—Michael A. Lyons
(74) Attorney, Agent, or Firm—Hitt Gaines P.C.

(57) ABSTRACT

The present invention provides an interferometer. In one embodiment, the interferometer includes a translucent body having a first portion and a second portion, where the second portion has at least three internal reflective sides. The interferometer also includes an interface between the first and second portions, configured to reflect a portion of an optical signal received through the first portion and transmit a remaining portion of the optical signal into the second portion. Also disclosed are a method of manufacturing an interferometer and a transmitter incorporating the interferometer or the method.

20 Claims, 3 Drawing Sheets

INTERFEROMETER HAVING IMPROVED MODULATION DEPTH AND FREE-SPECTRAL RANGE AND METHOD OF MANUFACTURING

TECHNICAL FIELD OF THE INVENTION

The present invention is directed, in general, to optical devices and, more specifically, to an interferometer having a first portion and a second portion with an interface therebetween and where the second portion has at least three internal reflective sides, and a method of manufacturing the same.

BACKGROUND OF THE INVENTION

Optical communication systems have continued to gain popularity in today's data transmission markets. Primarily because of their fast transmission speed and relatively precise manufacture, optical communication systems incorporating numerous optical devices and assemblies have become the systems of choice for technology companies desiring high-speed information transmission capabilities. Accordingly, as the transfer of information becomes one of the most valuable commodities in the world, optical device manufacturers are eager to develop further improvements in optoelectronic technology.

One area relating to optical devices that has seen significant improvement in recent times is in optical interferometers often associated with optical transmitters. More specifically, interferometers, which are instruments that can measure a length in terms of the length of a wave of light by using interference phenomena based on the wave characteristics of light, have been employed in optoelectronic laser devices found in optical transmitters. In such applications, interferometers are used as wavelength lockers to select and stabilize the desired wavelength of the laser generated in the transmitter by determining a precise relationship between the intensity of optical interference and wavelength of the laser. Perhaps the most common types of interferometers employed as wavelength lockers use Fabry-Perot etalons to create the needed lightwave interference. A Fabry-Perot etalon is typically constructed from two flat translucent plates separated by a parallel spacer, all three of which have an index of refraction associate therewith, with the inner surfaces of the plates coated with a partially reflecting layer. When the etalon is placed in a beam of light, it produces a multiple beam interference that may be measured to assist in locking the wavelength of a laser within an optical transmitter.

Unfortunately, such conventional interferometers suffer from several disadvantages, primarily because of the response of the conventional etalons employed therein. For example, the response of conventionally used etalons may present issues with low slope regions, poor modulation depth, back-reflection, small Free-Spectral-Range (FSR), and high manufacturing cost.

In conventional interferometers, the reflectivity of the two etalon surfaces is typically selected to strike a balance between low-slope regions and modulation depth of the interference signal generated from the etalon. Due to the multiple-beam interference produced in a conventional etalon, the reflectivity of the etalon has opposing effects on the low-slope regions versus the modulation depth of the output signal. More precisely, if the modulation depth is increased by increasing the reflectivity, the low-slope regions also increase, which is undesirable and tends to limit their capabilities as wavelength lockers.

In addition, the reflective coating between the first plate and the parallel spacer often causes at least a part of the incoming optical signal to be reflected back to the laser. Thus, conventional etalons usually require mounting at an odd angle in the interferometer, or the placing of an isolator between the incoming optical signal and the etalon, to prevent back-reflection of the incoming optical signal back to the laser. However, if an etalon is placed at such an angle, the output of the etalon usually becomes very sensitive to even minor mechanical changes or deformations of the interferometer. Consequently, the manufacturing tolerances become very tight, which results in a relatively prohibitive design to manufacture. Although an isolator may be used, as mentioned above, its use adds to manufacturing costs and process time, as well as inventory costs.

Furthermore, the thickness of the parallel spacer of the etalon is often increased in an attempt to shorten the FSR (e.g, shorten the distance (in frequency space) between adjacent transmission peaks) of the output interference signal. However, current trends in the design of optical laser packages, which are typically fixed by the telecommunications community, typically do not offer ample space. As a result, optical components in such packages typically need to be compact. Thus, increasing the size of the etalon in any respect is highly undesirable.

Accordingly, what is needed in the art is an interferometer for use as a wavelength locker in optical laser devices that does not suffer from the deficiencies found in the prior art.

SUMMARY OF THE INVENTION

To address the above-discussed deficiencies of the prior art, the present invention provides an interferometer, which in one embodiment, includes a translucent body having a first portion and a second portion, where the second portion has at least three internal reflective sides. The interferometer also includes an interface between the first and second portions, configured to reflect a portion of an optical signal received through the first portion and transmit a remaining portion of the optical signal into the second portion.

In another aspect, the present invention provides a method of manufacturing an interferometer. In one embodiment, the method includes providing a first translucent body, and providing a second translucent body having at least three internal reflective sides. In addition, the method includes coupling the first and second translucent bodies to form an interface. The interface can be configured to reflect a portion of an optical signal received through the first translucent body and transmit a remaining portion of the optical signal into the second translucent body.

In yet another aspect, the present invention provides a transmitter that includes a radiation source and an interferometer optically coupled to the radiation source. The transmitter further includes a translucent body having a first portion and a second portion, and an interface between the first and second portions. In this embodiment, the second portion has at least three internal reflective sides. In addition, the interface is configured to reflect a portion of an optical signal received through the first portion and transmit a remaining portion of the optical signal into the second portion.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the present invention.

BRIEF DESCRIPTION OF THE DRAWINGS

For a more complete understanding of the present invention, reference is now made to the following detailed description taken in conjunction with the accompanying FIGURES. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

Figure 1:
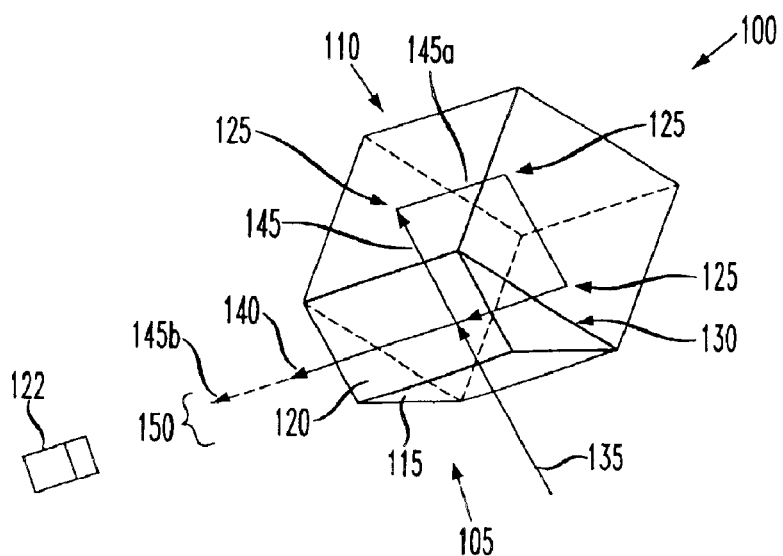
FIG. 1 illustrates an isometric view of one embodiment of an interferometer constructed according to the principles of the present invention.

Referring initially to FIG. 1, illustrated is an isometric view of one embodiment of an interferometer 100 constructed according to the principles of the present invention. In accordance with the present invention, the interferometer 100 is a translucent body, which includes first and second translucent portions 105, 110, respectively. In the illustrated embodiment, the first translucent portion 105 is a right triangular-shaped prism. It should be noted that while FIG. 1 illustrates a right triangular-shaped body, other geometries may also be applicable in the present invention.

In such an embodiment, the first translucent portion 105 includes a first side 115 that is positioned at an angle normal to a radiation source, such as a laser (not shown), and a second side 120 that is positioned at an angle normal to a detector 122, such as a photodetector. The first translucent portion 105 couples to the second translucent portion 110 at an interface 130. Preferably, the interface 130 has a reflectivity (R) that provides the best modulation depth at the output. As illustrated, the second translucent portion 110 may be a cube-shaped body, however, like the first translucent portion 105, the second translucent portion 110 is not limited to any particular geometric shape, as long as it includes at least three internal reflective sides 125. In the illustrated embodiment, the second translucent portion 110 includes four internal reflective sides 125. Alternatively, the first translucent portion 105 may be a first translucent body and the second translucent portion 110 may be a second translucent body that are joined at the interface 130 with a conventional adhesive, which forms a portion of the interface 130 and is discussed in more detail below.

In an advantageous embodiment, the first and second translucent portions 105, 110 each have a refractive index associated with the respective material from which each portion is constructed. Preferably, the refractive indices associated with each are substantially equal, which may be achieved by constructing each of the first and second translucent portions 105, 110 from the same material. Examples of such materials include, but are not limited to, lithium calcium aluminum hexafluoride ($LiCaAlF_6$) or high purity fused silica. Of course, those who are skilled in the art are capable of identifying other appropriate construction materials.

In function, an optical signal 135, for example, a collimated light ray from a laser (not shown), enters the first side 115 of the first translucent portion 105. In one embodiment, the optical signal 135 enters the first translucent portion 105 along a path that is normal to the first side 115. Compensating for refraction of the incoming optical signal may be avoided by entering along a normal to the first side 115. In addition, in an exemplary embodiment, the first side 115 is coated with a conventional anti-reflective (AR) coating to help ensure that none of the optical signal 135 is back-reflected to the radiation source.

As the optical signal 135 passes through the first translucent portion 105, it impacts the interface 130 and splits the optical signal 135 into a reflected portion or ray 140 and a transmitted portion or ray 145. The reflected portion 140 propagates out of the first translucent portion 105 through the second side 120. In an advantageous embodiment, the first translucent portion 105 is an isosceles right-angle prism, and the interface 130, forms a 45 degree angle with the first and second sides 115, 120, respectively. As a result, the optical signal 135 impacts the interface 130 at a 45 degree angle, causing the reflected portion 140 to exit the second side 120 at an angle normal thereto. In an advantageous embodiment, a conventional AR coating may be located on the second side 120 to enhance the reduction or elimination of back reflection.

The transmitted portion 145 is transmitted into the second translucent portion 110 to be reflected off the plurality of internal reflective sides 125 within the second translucent portion 110. This multiple reflection increases or "folds" its optical path length, which decreases the free spectral range of the device. As illustrated, the transmitted portion 145 enters the second translucent portion 110 and becomes an internal reflected ray 145a by reflecting off reflective sides 125 and to the interface 130. If desired, the reflective sides 125 may also include a conventional reflective coating thereon to facilitate internal reflection. Alternatively, an angle of incidence for the transmitted ray 145 may be selected, depending on the number of reflective sides 125, to provide for total internal reflection of the transmitted ray 145 while propagating through the second translucent portion 110. Once the internal reflected ray 145a impacts the interface 130, a portion 145b of the internal reflected ray 145a is transmitted through the interface 130 to interfere with the reflected portion 140, and, together, exit the first translucent portion 105 as an interference ray 150. A portion of the internal reflected ray 145a (not shown) that does not pass through the interface 130 is diminished in intensity and is internally reflected within the second translucent portion 110 and transmitted from the interferometer 100, as previously described.

These cycles of internal reflection continue to occur inside the second translucent portion 110 with a portion of each diminished internal reflected ray 145a being transmitted through the interface 130 to interfere with the reflected ray 140, and a further diminished portion (not shown) being reflected off the interface 130 around the second translucent portion 110. This process repeats as the intensity of the reflected portions of the internal transmitted ray 145a continues to diminish by being reflected multiple times within the second translucent portion 110, while a portion is transmitted through the interface 130 with each reflective cycle. However, as this occurs, another optical signal 135 may be input to the interferometer 100 from the laser. As a result, portions of the internal reflected ray 145a, which have varying intensities, consistently exit the second translucent portion 110 through the interface 130 and interfere with reflected ray 140 to provide the interference ray 150 exiting the interferometer 100.

Figure 2:
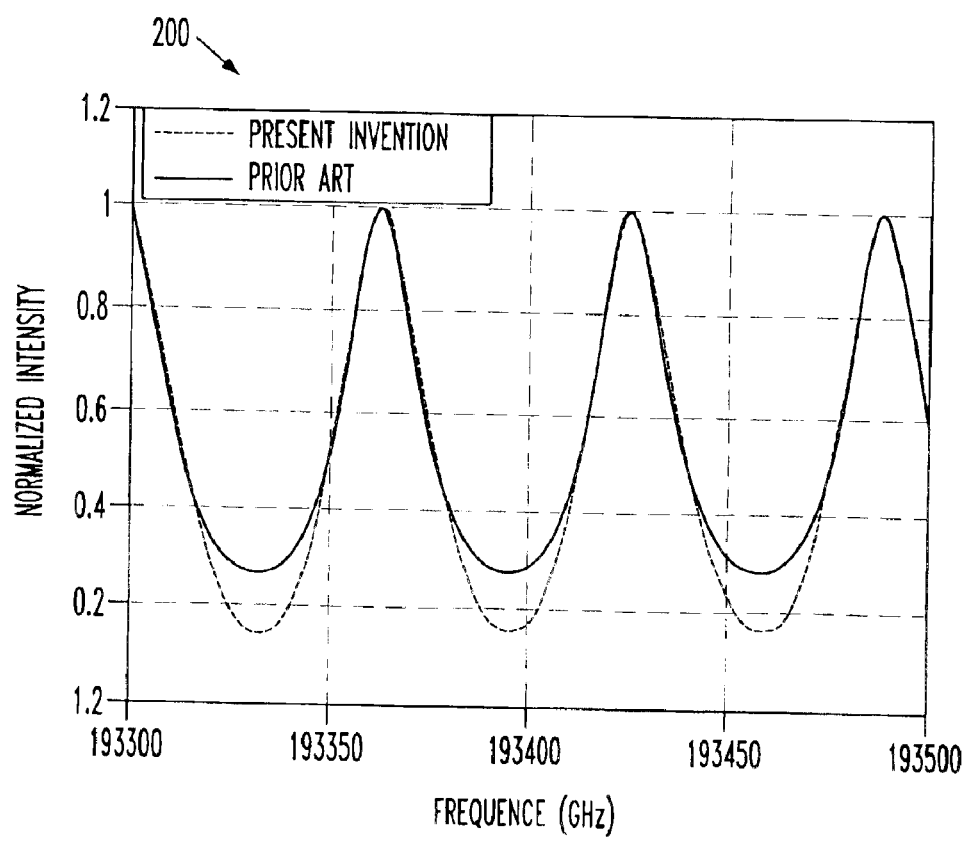
FIG. 2 illustrates a plot of normalized interference intensity (I) with respect to phase for the interferometer illustrated in FIG. 1 versus an interferometer having a conventional etalon positioned therein.

In embodiments where the interface 130 is an adhesive, as noted above, the adhesive may have a reflectivity (R) specially chosen such that the interface 130 reflects a greater or lessor portion of the incoming optical signal 135 than the remaining portion allowed to pass through the interface 130. By selecting the reflectivity of the interface 130 in this manner, a desirable modulation depth for optical signals output from the interferometer 100 may be chosen, based on the reflected versus transmitted portions of the incoming optical signal 135. Although not necessary to practice the present invention, it is noted that selecting a reflectivity of 50% for the interface 130 typically provides optimal intensity results, as illustrated in FIG. 2, by splitting the optical signal 135 substantially in half, rather than in a different ratio. Such adhesives are commonly available from optic device retailers and typically employ a reflective coating that may be used as described with an optical interferometer manufactured according to the present invention.

In the illustrated embodiment, the optical path length of the transmitted ray 145 provided by the second translucent portion 110 differs from the optical path length provided by conventional etalons, formed from two separated parallel plates, found in typical interferometers by:

$$2\sqrt{2}d \quad (1)$$

where d is the thickness of the second translucent portion 110, measured from the interface 130 to the side opposite the interface 130, and assuming the distance between the remaining two reflective sides 125 is substantially the same. For instance, using equation (1), to provide a 25 GHz Free Spectral Range (FSR), a conventional interferometer would typically require an etalon about 4 mm thick, where the thickness is measured by the spacing between the two parallel plates. In contrast, an interferometer constructed according to the present invention would only require a second translucent portion 110 having a thickness of about 2.82 mm.

The substantially larger thickness of conventional devices is due to the flat structure, and limited number of reflective sides, of conventional etalons, such as Fabry-Perot etalons, typically found in conventional interferometers. More specifically, in such conventional etalons a portion of an incoming optical signal is reflected from the first plate, while a second portion passes through and into the spacer material to be reflected from the second plate back toward the first plate. The distance traveled by the transmitted portion of the optical signal propagating through the spacer material and reflecting back toward the first plate is the optical path length of the transmitted portion. As a result, when the optical path length is defined by only one such reflection, the thickness of conventional etalons must be substantially increased in order to make a significant impact on the optical path length.

In contrast, the minimum of three reflective sides of an interferometer constructed according to the present invention allows the optical path length to be increased by reflecting a portion of an incoming optical signal off of each reflective side within the second translucent portion 110 before creating an interference ray. Those who are skilled in the art will understand the significant advantages associated with decreasing the overall size of an interferometer, for example, in manufacturing smaller optical transmitters.

Once the interference ray 150 is created, it propagates towards the detector 122 for use in tuning and locking a particular wavelength of a laser source. Specifically, the interferometer 100 is used to determine a precise relationship between the laser's intensity and wavelength to control its wavelength. The implementation of the interferometer 100, in combination with the detector 122 and other components, to control the wavelength of the laser is discussed in greater detail below.

Turning now to FIG. 2, illustrated is a plot 200 of normalized interference intensity (I) with respect to phase for the interferometer 100 illustrated in FIG. 1 versus an interferometer having a conventional etalon located therein. More precisely, FIG. 2 illustrates the comparison where the reflectivity of the interface 130 is selected such that about one-half of the incoming optical signal 135 is reflected out of the first translucent portion 105 and about one-half is transmitted into the second translucent portion 110. The plot of the interference intensity of the interferometer 100 of the present invention is denoted as "Present Invention" and illustrated in dotted-line. The plot of the interference intensity of a conventional interferometer (for example, having a Fabry-Perot etalon) is denoted as "Prior Art" and illustrated in solid line.

As illustrated in the plot 200, the interferometer 100 of the present invention provides better modulation depth and, hence, more high-slope regions than a conventional interferometer. Specifically, the plot 200 reveals that the modulation depth is increased by 17%, and the high-slope coverage is increased by 11%, over a conventional etalon interferometer. As mentioned above, it is noted that the illustrated results are achieved when the interface 130 is configured to have a reflectivity of about 50%, thus splitting the optical signal 135 substantially equally as it first strikes the interface 130. Moreover, as discussed above, such beneficial results provided by the present invention may be achieved while still decreasing the thickness of the interferometer 100 when compared to the thickness of etalons typically found in conventional interferometers, thus allowing for more compact optical transmitters.

Figure 3:
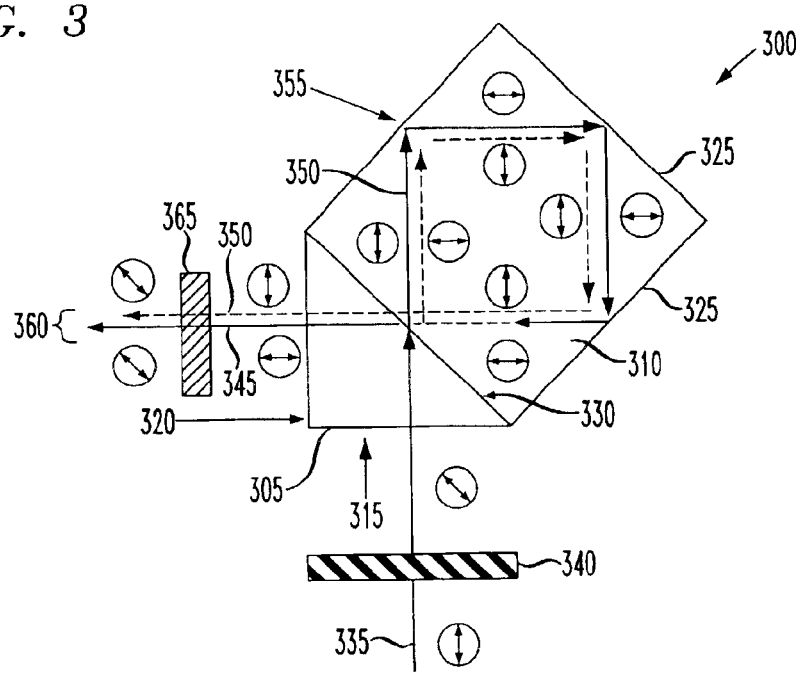
FIG. 3 illustrates an overhead view of another embodiment of an interferometer constructed according to the principles of the present invention.

Referring now to FIG. 3, illustrated is an overhead view of another embodiment of an interferometer 300 constructed according to the principles of the present invention. As with the interferometer 100 in FIG. 1, the interferometer 300 in FIG. 3 may also be a translucent body having first and second translucent portions 305, 310, or may be a first body 305 coupled to a second body 310 as previously described. As before, the interferometer 300 will be discussed in terms of a first translucent portion 305 coupled to a second translucent portion 310, however the present invention is not so limited.

In FIG. 3, the first translucent portion 305 is illustrated having a right triangular shape with first and second sides 315, 320 joined at a 90 degree angle opposite an interface 330. The interface 330 is adjacent to one of a plurality of reflective sides (generally designated 325) of the second translucent portion 310 to couple the first and second translucent portions 305, 310 together. In an exemplary embodiment, the interface 330 may again be an adhesive used to hold the first and second translucent portions 305, 310 together, and may have a reflectivity selected to provide the best modulation depth at the output of the interferometer 300, as previously described. Furthermore, both the first and second translucent portions 305, 310 may have a substantially equal refractive index associated with the materials used to construct each one. As before, such substantially equal indices of refraction may be achieved by constructing each from the same material.

The function of the interferometer 300 in FIG. 3 is similar to that of FIG. 1 in that an optical signal 335, for example, in the form of a collimated light ray from a laser generator (not illustrated), enters the first side 315 of the first translucent portion 305. However, before entering the interferometer 300, the optical signal 335 may be passed through a polarization rotator plate 340, which rotates the polarization of the optical signal 335 as desired. The polarization rotator plate 340 may be a Faraday rotator, comprised of non-optically active materials and designed to rotate the plane of polarization of the optical signal 335 passing therethrough. Those who are skilled in the art understand well how to achieve such so-called "Faraday rotation" of the optical signal 335.

In the illustrated embodiment, the polarization of the optical signal 335 is rotated to about 45 degrees, and the interface 330 is oriented to an angle substantially parallel with this new plane of polarization. As a result, the interface 330 beneficially splits the incoming optical signal into reflected and transmitted portions. More specifically, the reflected portion is the horizontal component of the optical signal 335 (reflected ray 345 having a horizontal polarization symbol) and the transmitted portion is the vertical component (transmitted ray 350 having a vertical polarization symbol). This is accomplished by providing an interface 330 configured to reflect horizontal components of a polarized optical signal, while allowing vertical components to pass through. Such an interface 330 may be provided by the use of a conventionally available adhesive, such as a polarizing-beam-splitter. Thus, by rotating the polarization of the optical signal 335 to 45 degrees and providing the interface 330 with a polarizing-beam-splitter, substantially equal horizontal and vertical components of the optical signal 335 are reflected and transmitted, respectively, by the interface 330.

As with the interferometer 100 in FIG. 1, directing the optical signal 335 such that it enters the first side 315 at a normal thereto may advantageously reduce or eliminate back-reflections of the optical signal 335. Additionally, in an exemplary embodiment of the interferometer 300, the first side 315 may also be coated with a conventional AR coating to further ensure that back-reflections are reduced or eliminated. Furthermore, after impacting the interface 330, the reflected ray 345, having only horizontal polarization, reflects from the interface 330 and propagates out of the first portion 305 through the second right-angle side 320. Orienting the interface 330 to a 45 degree angle, as in the illustrated embodiment, allows the reflected ray 345 to exit the second right-angle side 320 at a normal thereto, also reducing or eliminating back-reflection therefrom. Moreover, the second side 320 may also include a conventional AR coating, to further reduce or eliminate the chance for back-reflection of the reflected ray 345.

The transmitted ray 350, having only vertical polarization, is transmitted into the second translucent portion 310 to be reflected off of the reflective sides 325 within the second portion 310 in order to increase its optical path length. More specifically, the transmitted ray 350 initially impacts one of the reflective sides 325 that may include a polarization rotator film 355 located thereon. The polarization rotator film 355, which is conventionally available, is selected such that the polarization of the transmitted ray 350 is rotated 90 degrees, from substantially vertical to substantially horizontal (as denoted by the change in polarization symbol from vertical to horizontal for the transmitted ray 350). The transmitted ray 350 then reflects off of the other reflective sides 325 within the second translucent portion 310, which may have a reflective coating, until it reaches the interface 330. Since the polarization of the transmitted ray 350 has been rotated to substantially horizontal, and the interface 330 has been configured to reflect all horizontal components, the transmitted ray 350 (now illustrated in broken line) is reflected by the interface 330 and propagated towards the polarization rotator film 355 again.

Once the transmitted ray 350 again impacts the polarization rotator film 355 during its second reflective cycle, its angle of polarization is again rotated by 90 degrees, from substantially horizontal to substantially vertical (as denoted by the change in polarization symbol from horizontal back to vertical). The transmitted ray 350 is then again reflected off the other reflective sides 325 within the second translucent portion 310 until it again reaches the interface 330. Since the polarization of the transmitted ray 350 has been rotated back to substantially vertical, and the interface 330 has been configured to allow all vertical components to pass therethrough, the transmitted ray 350 passes through the interface 330 and exits the second right-angle side 320 after its second reflective cycle within the second portion 310. Like the reflected ray 345, the transmitted ray 350 may exit the second side 320 at a normal thereto to reduce or eliminate back-reflection, depending on the orientation of the interface 330 with respect to the second side 320.

The reflected ray 345 and the transmitted ray 350 interfere to form an interference ray 360 having a polarization based on the combination of the horizontal and vertical components of the reflected and transmitted rays 345, 350, respectively. The interference ray 360 is then transmitted through a linear polarizer 365 positioned at the output of the interferometer 300. The linear polarizer 365 may be included to alter or filter the polarization of the interference ray 360 to a desired angle of polarization. In addition, like the polarization rotator plate 340, the linear polarizer 365 may be a conventionally available device whose use is well known in the art. Once the interference ray 360 is created by the interferometer 300, it may be used, in combination with photodetectors and other components, to control the wavelength of a laser output from a laser generator, as discussed in further detail below.

As may be seen in FIG. 3, in this embodiment of an interferometer constructed according to the principles of the present invention, the optical path of the transmitted ray 350 within the second translucent portion 310 is somewhat different than the embodiment illustrated in FIG. 1. For example, in the interferometer 100 of FIG. 1, the transmitted ray 140 is repeatedly reflected with diminishing intensity within the second translucent portion 110, with a portion of the transmitted ray 140 passing through the interface 130 during each cycle of internal reflection. As a result, the optical path length of a primary portion of the wavelength passing through the interface 130 to interfere with the reflected ray 140 is only the length of one reflective cycle.

In contrast, in the interferometer 300 of FIG. 3, the transmitted ray 350 is reflected within the second translucent portion 310 for exactly two reflective cycles. As a result, no portion of the transmitted ray 350 passes through the interface 330 after only the first reflective cycle within the second portion 310, while all of it passes through after the second reflective cycle. Thus, in this embodiment, the optical path length of the interference ray 360 is even increased above the optical path length of the interference ray 150 generated by the interferometer 100 of FIG. 1, which produces an even shorter free spectral range.

Figure 4:
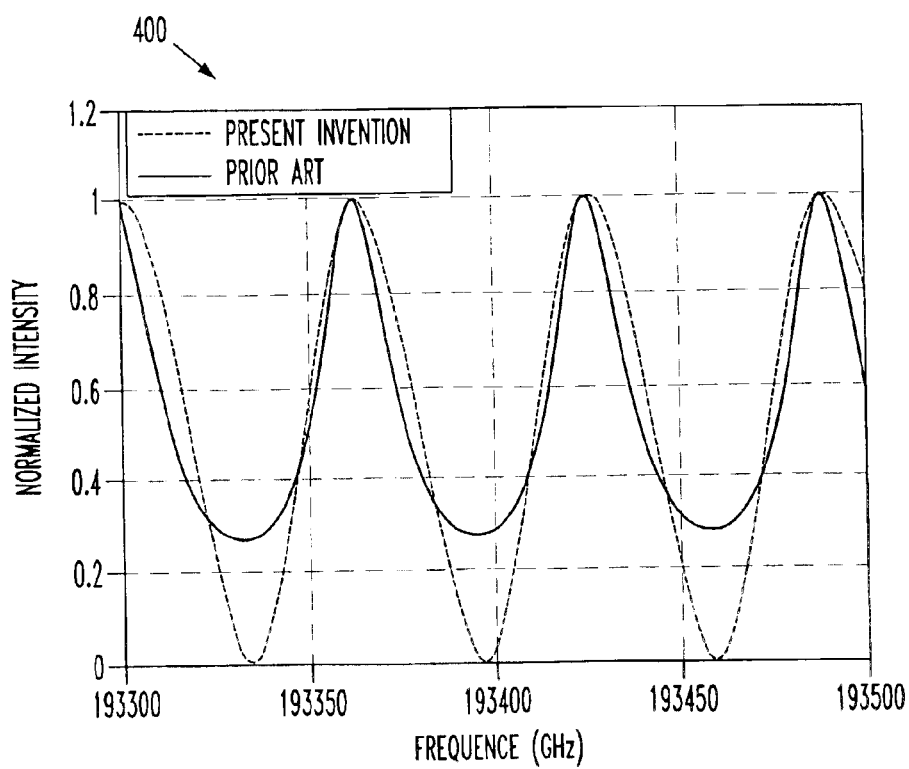
FIG. 4 illustrates a plot of normalized interference intensity (I) with respect to phase for the interferometer illustrated in FIG. 3 versus an interferometer having a conventional etalon positioned therein.

Looking now at FIG. 4, illustrated is a plot 400 of normalized interference intensity (I) with respect to phase for the interferometer 300 illustrated in FIG. 3 versus an interferometer having a conventional etalon positioned therein. Like FIG. 2, FIG. 4 illustrates the comparison where a reflectively of about 50% at the interface 330 is selected such that about one-half of the incoming optical signal 335 is reflected out of the first portion 305 and about one-half is transmitted into the second portion 310. The plot of the interference intensity of the interferometer 300 of FIG. 3 is denoted as "Present Invention" and illustrated in dotted-line. The plot of the interference intensity of a conventional interferometer (for example, having a Fabry-Perot etalon) is denoted as "Prior Art" and illustrated in solid line.

As illustrated in the plot 400, the interferometer 300 of FIG. 3 provides an increased modulation depth of about 40%, and high-slope coverage increased by about 40%, over a conventional etalon interferometer. In addition, when compared to the plot 200 of FIG. 2, the interferometer 300 illustrated in FIG. 3 even provides an increased modulation depth of about 20%, and high-slope coverage increased by about 30%, over the interferometer 100 illustrated in FIG. 1, based at least in part on the increased optical path length provided by the interferometer 300 in FIG. 3. Moreover, the beneficial results of the interferometer 300 may be achieved while still decreasing its thickness when compared to the thickness of the conventional interferometer.

Figure 5:
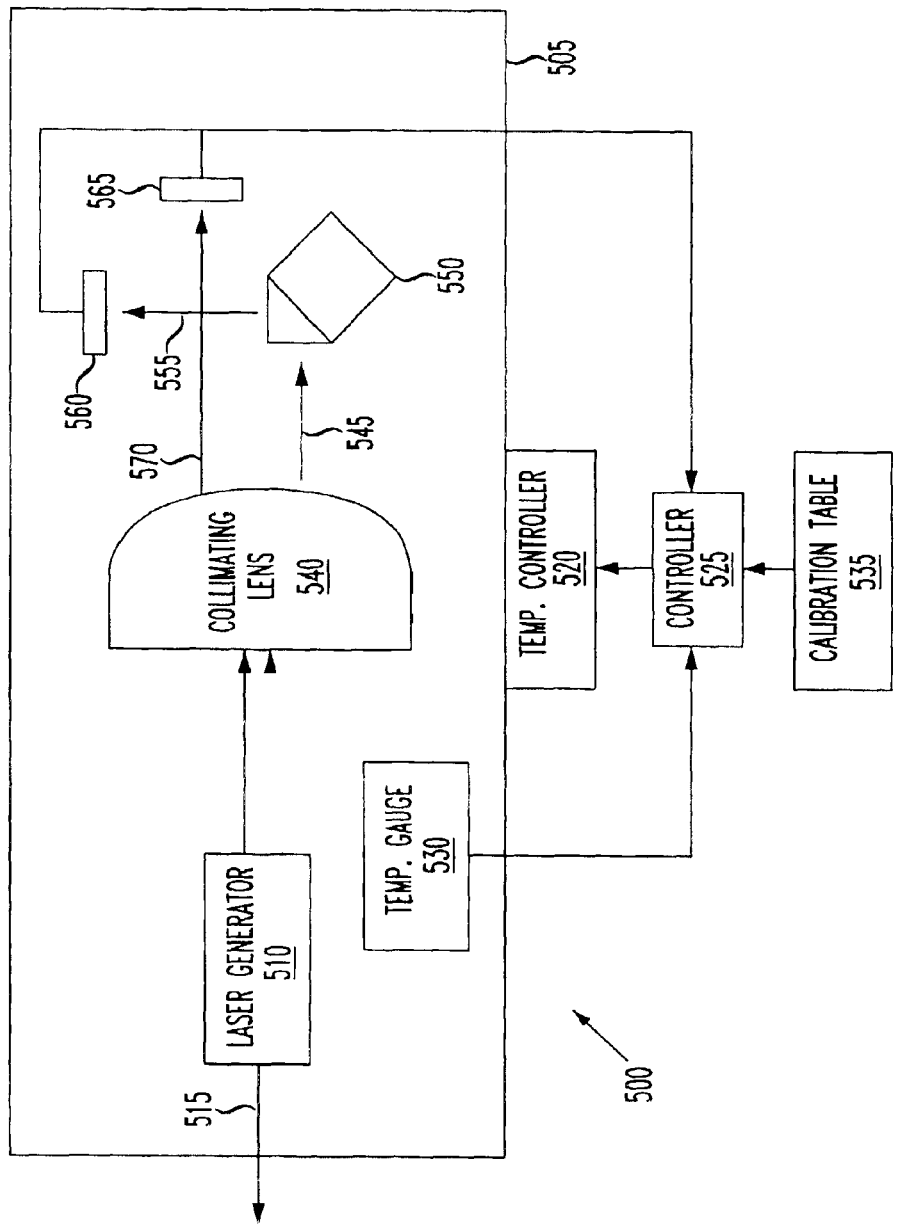
FIG. 5 illustrates a functional block diagram of one embodiment of an optical transmitter, which may form an environment for an optical interferometer constructed according to the principles of the present invention.

Turning finally to FIG. 5, illustrated is a functional block diagram of one embodiment of an optical transmitter 500, which may form an environment for an optical interferometer constructed according to the principles of the present invention. The transmitter 500 includes a laser package 505 having a laser generator 510 for generating an output laser 515 to be transmitted across an optical network. The laser package 505 also includes a temperature control system, for controlling the wavelength of the laser 515, that includes a temperature controller 520, a controller 525, a temperature gauge 530, and a calibration table 535. The laser package 505 further includes a collimating lens 540 that receives a sample laser from the laser generator 510 for use in adjusting and locking the wavelength of the laser 515.

The collimating lens 540 collimates the sample laser into an optical signal 545 that is input into an interferometer 550 constructed according to the principles of the present invention. An interference ray 555, created from the optical signal 545 by the interferometer 550, is input to a first photodetector 560 and used to determine a precise relationship between the intensity and wavelength of the laser 515 transmitted from the laser generator 510 in order to control the wavelength of the laser 515. Since the wavelength of the laser 515 is a function of the temperature of the laser generator 510, the interferometer 550, photodetector 560 and temperature system are used, in combination with a second photodetector 565 that receives a reference ray 570 also based on the sample laser, to control the temperature of the laser generator 510. The photodetectors 560, 565 create signals employed by the controller 525 to control the temperature of the laser generator 510 and, thus, tune and lock the wavelength of the laser 515.

Looking more specifically at tuning the laser 515 using the present invention, the calibration table 535 is typically generated after the laser package 505 is manufactured, and is used in tuning the wavelength of laser 515. The calibration table 535 contains several data points with numerical values of wavelength, outputs of the photodetectors 560, 565, and the temperature of the laser generator 510. The calibration table 535 is generated by observing the laser 515 emanating from the front side of the laser generator 510, the temperature detected by the temperature gauge 530, and the signals generated by the photodetectors 560, 565. The signals from the photodetectors 560, 565 are compared to the values in the calibration table 535, which then cause the controller 525 to generate an error signal. The error signal is used to operate the temperature controller 520, which is typically a thermoelectric cooler. The temperature controller 520 detects the temperature of the laser generator 510 and modifies it based on the error signal to achieve the desired wavelength of the laser 515. Of course, it should be noted that an optical transmitter constructed according to the present invention is not limited to the components previously mentioned, and may include other elements as each application requires.

Although the present invention has been described in detail, those skilled in the art should understand that they can make various changes, substitutions and alterations herein without departing from the spirit and scope of the invention in its broadest form.

What is claimed is:

1. An interferometer, comprising:
a translucent body having a first portion and a second portion, and an interface between said first and second portions, said second portion having at least three internal reflective sides, said interface configured to reflect a portion of an optical signal received through said first portion, cause said reflected portion to exit said first portion without further reflection within said interferometer, and transmit a remaining portion of said optical signal into said second portion.

2. The interferometer as recited in claim 1 wherein said second portion is configured to internally reflect said remaining portion and said interface is further configured to allow transmission of said remaining portion through said first portion.

3. The interferometer as recited in claim 1 wherein a first one of said at least three internal reflective sides includes a polarization rotator film that rotates a polarization of said remaining portion to produce a rotated internally reflected optical signal such that said rotated internally reflected optical signal may pass through said interface and said first portion.

4. The interferometer as recited in claim 1 wherein said interface is configured to reflect a horizontal component of said optical signal and transmit a vertical component of said optical signal.

5. The interferometer as recited in claim 4 further comprising a polarization rotator plate proximate said first portion and configured to rotate a polarization of said optical signal.

6. The interferometer as recited in claim 1 wherein said first portion is a right triangular-shaped body having first and second sides having an anti-reflective coating thereon and positioned to receive said optical signal at an angle normal to a first side of said first portion, and wherein said second portion is a cube-shaped translucent body having four internal reflective sides.

7. The interferometer as recited in claim 1 wherein said interferometer forms at least a portion of a transmitter having a radiation source associated therewith.

8. A method of manufacturing an interferometer, comprising:

providing a first translucent body;

providing a second translucent body having at least three internal reflective sides; and coupling said first and second translucent bodies to form an interface configured to reflect a portion of an optical signal received through said first translucent body, cause said reflected portion to exit said first portion without further reflection within said interferometer, and to transmit a remaining portion of said optical signal into said second translucent body.

9. The method as recited in claim 8 wherein said providing a second translucent body includes providing a second translucent body configured to produce at least a three-folded internally reflected optical signal from said remaining portion, and said coupling includes forming an interface configured to allow transmission of said at least three-folded internally reflected optical signal through said first translucent body.

10. The method as recited in claim 8, further comprising providing a polarization rotator film on a first one of said at least three internal reflective sides that rotates a polarization of said remaining portion of said optical signal to produce a rotated internally reflected optical signal such that said rotated internally reflected optical signal may pass through said interface.

11. The method as recited in claim 8 wherein said coupling includes coupling with an interface surface configured to reflect a horizontal component of said optical signal and transmit a vertical component of said optical signal.

12. The method as recited in claim 11, further comprising providing a polarization rotator plate proximate said first translucent body and configured to rotate a polarization of said optical signal.

13. The method as recited in claim 8 wherein said providing a first translucent body includes providing a right triangular-shaped translucent body positioned to receive said optical signal at an angle normal to a first side of said first translucent body, and wherein said providing a second translucent body includes providing a cube-shaped translucent body having body four includes internal reflective sides.

14. The method as recited in claim 13 wherein said providing a first translucent body includes providing a right triangular-shaped translucent body further having a second side and wherein each of said first and second sides of said first translucent body includes an anti-reflective coating thereon.

15. A transmitter, comprising:

a radiation source; and an interferometer optically coupled to said radiation source, including:

a translucent body having a first portion and a second portion, and an interface between said first and second portions, said second portion having at least three internal reflective sides, said interface configured to reflect a portion of an optical signal received through said first portion, cause said reflected portion to exit said first portion without further reflection within said interferometer, and transmit a remaining portion of said optical signal into said second portion.

16. The transmitter as recited in claim 15 wherein a first one of said at least three internal reflective sides includes a polarization rotator film that rotates a polarization of said remaining portion of said optical signal to produce a rotated internally reflected optical signal such that said rotated internally reflected optical signal may pass through said interface.

17. The transmitter as recited in claim 15 wherein said interface is configured to reflect a horizontal component of said optical signal and transmit a vertical component of said optical signal.

18. The transmitter as recited in claim 15 further comprising a control system for controlling an output of said radiation source and said interferometer is coupled to said control system to provide an input signal to said control system.

19. The transmitter as recited in claim 18 wherein said control system includes a temperature gauge, a calibration table, and a temperature controller that are coupled to a controller to control said output of said radiation source based on said input signal.

20. The transmitter as recited in claim 15 further including a polarization rotator plate proximate said first portion and configured to rotate a polarization of an optical signal to be received in said first portion.

* * * * *